United States Patent
Matsutani

(10) Patent No.: US 6,576,152 B2
(45) Date of Patent: Jun. 10, 2003

(54) DRY ETCHING METHOD

(75) Inventor: Tetsuya Matsutani, Kyoto (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/899,548

(22) Filed: Jul. 6, 2001

(65) Prior Publication Data

US 2002/0008083 A1 Jan. 24, 2002

(30) Foreign Application Priority Data

Jul. 6, 2000 (JP) .................................... 2000-205661

(51) Int. Cl.$^7$ ............................................. C23F 7/00
(52) U.S. Cl. .......................... 216/72; 216/11; 216/58; 216/63; 216/67; 216/68; 216/74; 216/75; 216/79; 438/706; 438/707; 438/710; 438/719; 438/720; 438/733; 438/735; 438/737; 438/738; 438/742
(58) Field of Search ................... 216/11, 58, 63, 216/67, 68, 72–74, 75, 79; 438/706, 707, 710, 719, 720, 733, 735, 737, 738, 742

(56) References Cited

U.S. PATENT DOCUMENTS

| | | | |
|---|---|---|---|
| 4,377,734 A | * 3/1983 | Mashiko et al. ........ 204/192.32 |
| 4,836,886 A | * 6/1989 | Daubenspeck ............. 156/643 |
| 4,836,887 A | * 6/1989 | Daubenspeck et al. ..... 156/643 |
| 5,108,542 A | * 4/1992 | Lin ........................... 156/643 |
| 5,112,435 A | * 5/1992 | Wang et al. ............... 156/643 |
| 5,147,500 A | * 9/1992 | Tachi et al. ............... 154/643 |
| 5,164,331 A | * 11/1992 | Lin et al. .................. 437/192 |
| 5,212,147 A | * 5/1993 | Sheats ......................... 505/1 |
| 5,609,775 A | * 3/1997 | Liu ............................. 216/77 |
| 5,767,021 A | * 6/1998 | Imai et al. .................. 438/719 |
| 5,846,886 A | * 12/1998 | Hattori et al. ............. 438/740 |
| 5,856,239 A | * 1/1999 | Bashir et al. .............. 438/738 |
| 5,866,483 A | * 2/1999 | Shiau et al. ............... 438/720 |
| 5,975,685 A | * 11/1999 | Asaba et al. ................ 347/59 |
| 6,136,211 A | * 10/2000 | Qian et al. ................... 216/37 |
| 6,258,637 B1 | * 7/2001 | Wilk et al. ................. 438/151 |
| 6,277,733 B1 | * 8/2001 | Smith ......................... 438/636 |
| 6,413,874 B1 | * 7/2002 | Sato .......................... 438/458 |
| 6,432,832 B1 | * 8/2002 | Miller et al. ............... 438/701 |

FOREIGN PATENT DOCUMENTS

JP 09082686 3/1997

OTHER PUBLICATIONS

S. Arai et al., "Intensity Distribution of Plasma Emission in Low Temperature Etching," 1989 Autumn JSAP Annual Meeting, No. 2, p 464.

K. Tsujimoto, et al., "Low Temperature etching (XI)–W Etching," 1989 Autumn JSAP Annual Meeting, No. 2, p 464.

(List continued on next page.)

Primary Examiner—Randy Gulakowski
Assistant Examiner—M. Kornakov
(74) Attorney, Agent, or Firm—Parkhurst & Wendel, L.L.P.

(57) ABSTRACT

In a dry etching method for etching a structure obtained by successively depositing, on a substrate, a gate insulating film, a silicon base film, a tungsten film or an alloy film containing tungsten, the dry etching includes a first process of dry-etching the tungsten film or the alloy film including tungsten, and a second process of dry-etching the silicon base film, and the first process employs, as an etching gas, a gas mixture obtained by mixing $O_2$ gas into a gas including at least C and F, with the flow ratio of the $O_2$ gas being 10~50% by volume percentages. This dry etching method realizes highly-precise dry etching by which a vertical configuration of the poly-metal structure is obtained, and the selection ratio of W with respect to poly-Si can be controlled and, moreover, penetration through the underlying gate oxide film is prevented.

8 Claims, 6 Drawing Sheets

OTHER PUBLICATIONS

K. Iizuka, et al., "Effect of Water Temperature on Wsix/poly Si RIE," 1989 Autumn JSAP Annual Meeting, No. 2, p 464.

Y. Kato, et al. "Low–Temperature RIE of CVD–W/TiN/Ti," 1991 Spring JSAP Annual Meeting, No. 2, p 503.

S. Iida, et al., "Low–Temperature Etching of CVD–W," 1992 Autumn JSAP Annual Meeting, No. 2, p 465.

H. Hayashi, et al., "High Temperature W Etching By Using $Cl_2$ or Hbr," 1992 Autumn JSAP Annual Meeting, No. 2, p 465.

H. Kawakami, et al., "High Temperature Etching of Tungsten Poly–metal Gate," 1998 Autumn JSAP Annual Meeting, No. 2, p 640.

* cited by examiner

DRY ETCHING METHOD

FIELD OF THE INVENTION

The present invention relates to a dry etching method and, more particularly, to improved anisotropic dry etching on a lamination of a silicon base film, a tungsten film, and a tungsten alloy film, which dry etching is adopted mainly in a process of manufacturing a high-performance semiconductor device having a gate width narrower than 0.18 μm rules.

BACKGROUND OF THE INVENTION

In recent years, semiconductor devices have remarkably grown in performance, and further speedup and reduction in power consumption have been demanded.

For example, in a fine semiconductor device having a gate width narrower than 0.18 μm rules, for further improvement in performance of transistors, there has been promoted a transition from a conventional $N^+$ single gate structure to a dual gate structure in which a $P^+$ electrode is used for a P channel transistor while an $N^+$ electrode is used for an N channel transistor. On the other hand, for further speedup and reduction in power consumption, reduction in resistance of gate electrodes has been demanded.

Furthermore, in order to secure a margin for alignment between a gate electrode and an adjacent contact region, SAC (Self Align Contact) process has been employed.

As a gate electrode structure that satisfies the above-mentioned demands on the semiconductor device, a poly-metal electrode using tungsten is promising.

A poly-metal electrode is a kind of gate electrode structure, and it is not an ordinary gate electrode comprising only poly-silicon but a gate electrode made by stacking a metal layer such as tungsten on poly-silicon. The poly-metal electrode realizes a lower resistance as compared with the gate electrode comprising poly-silicon alone, whereby speedup and reduced power consumption are achieved. Further, since the poly-metal electrode is consistent with the SAC process, it is suitable for high-density integration.

Hereinafter, a method for fabricating a poly-metal electrode structure will be described with reference to FIGS. 1(a)-1(c).

Initially, there are successively formed on a semiconductor substrate such as a silicon substrate 11, a gate oxide film 12 (e.g., 3 nm thick), a poly-silicon (poly-Si) film 13 (e.g., 100 nm thick), a tungsten nitride ($WN_x$) film 14 (e.g., 10 nm thick), a tungsten (W) film 15 (e.g., 100 nm thick), and a silicon nitride (SiN) film 16 (e.g., 150 nm thick), in this order. Preferably, the gate oxide film 12 is formed by thermal oxidation, and the poly-Si film 13 is formed by CVD (Chemical Vapor Deposition). Further, the $WN_x$ film 14 and the W film 15 are formed by sputtering or CVD, and the SiN film 16 is formed by CVD.

Next, the W film 15, the $WN_x$ film 14, and the poly-Si film 13 are subjected to anisotropic etching, using the SiN film 16 and the resist pattern 17 as masks, in an etching apparatus different from that used for the SiN film 16, thereby completing a poly-metal structure gate electrode (refer to FIG. 1(c)).

In this structure, the $WN_x$ film 14 functions as a barrier layer that prevents mutual diffusion between the W film 15 and the poly-Si film 13, and the SiN film 16 functions as a stopper layer in the SAC process.

Conventionally, as anisotropic etching of tungsten, low-temperature etching using $SF_6$ gas and high-temperature etching using $Cl_2$ gas have been carried out, as disclosed in the transactions of JSAP (Japan Society of Applied Physics) annual meetings as follows: 1989 Autumn JSAP annual meeting (Tsujimoto et al., No.2, p.464), 1991 Spring JSAP annual meeting (Kato et al. No.2, p.503, 28p-ZC-14), 1992 Autumn JSAP annual meeting (Iida et al., No.2, p.465, 16a-SK-8), and 1992 Autumn JSAP annual meeting (Hayashi et al., No.2, p.465, 16a-SK-9).

By the way, tungsten (W) has conventionally been used as a material for plugs, interconnections (bit lines) in DRAM, or the like. A typical wiring structure comprises a W layer having a thickness of 300~500 nm, a barrier layer comprising Ti or TiN and placed under the W layer, and a base comprising an oxide film as an inter-layer film.

In this structure, when using $SF_6$ as a main gas, anisotropic dry etching of W proceeds in a reaction as follows;

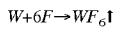

The reason why $SF_6$ gas is used as an etching gas is because the vapor pressure of $WF_6$ as a reaction product is high (i.e., $WF_6$ is easy to volatile) and a lot of F radicals are generated, whereby the relatively thick W film can be etched at a practical etching rate (400~600 nm/min).

However, if the etching gas used in the conventional dry etching of W is applied to, as it is, etching of the poly-metal structure shown in FIG. 1, the following drawbacks will occur.

Firstly, since the thickness of the W film 15 (100 nm or less) used in the poly-metal structure is less than that of the W layer (300~500 nm) used in the bit line wiring or the like, the etching rate by $SF_6$ is too high to control.

Secondly, $SF_6$ cannot perform selective etching of the W film 15 with respect to the underlying poly-Si film 13 and, moreover, the etching rate by $SF_6$ is higher in the poly-Si film 13 than in the W film 15. Therefore, in combination with the first problem, etching does not stop in the poly-Si film 13, and penetrates through the gate oxide film 12. As the result, a transistor cannot be fabricated.

Further, in the etching process to form the poly-metal electrode structure shown in FIG. 1, a vertical etching configuration and a high selectivity with respect to the gate oxide film 12 are demanded. To meet these demands, it is effective to use HBr base gas for etching of the poly-silicon film 13. However, the HBr base gas is improper as a main gas for etching of the W film 15 because the vapor pressure of $WBr_x$ is low.

Accordingly, in the etching process to form the poly-metal electrode structure shown in FIG. 1, it is difficult to use the same gas for etching of the W and $WN_x$ films 15 and 14 and for etching of the poly-Si film 13 and, therefore, these etching processes should be carried out under different conditions.

For example, when etching of the poly-metal structure is carried out by the conventional method described above, etching of the W and $WN_x$ films 15 and 14 should be carried out on a susceptor (a lower electrode serving as a substrate holder in the dry etching apparatus) having a low temperature (about -20° C.) when using $SF_6$ gas while it should be carried out on a susceptor having a high temperature (100° C. or higher) when $Cl_2$ gas is used. These temperature ranges are necessary to obtain vertical configurations while suppressing side-etching of the W and $WN_x$ films. However, if etching of the poly-Si film using HBr base gas is carried out under these temperature ranges, it is difficult to obtain the vertical configuration in either case.

This problem is described in the transaction of 1998 Autumn JSAP annual meeting (Kawakami et al., No.2, p.640, 16p-C-3), and an etching apparatus having plural etching chambers which are adapted to the properties of plural layers to be etched is required for etching to form a poly-metal gate electrode.

Therefore, there are considerable drawbacks in mass production, such as an increase in the initial cost of the etching apparatus, an increase in the failure rate due to the complicated device system, a reduction in the operation rate, and the like.

There is another problem about the selectivity of the underlying poly-Si film while etching the W and $WN_x$ films. If the selectivity of the poly-Si film is low in etching of the W and $WN_x$ film, etching does not stop in the poly-Si film and penetrates through the gate oxide film.

In order to increase the selectivity of poly-Si, for example, Japanese Published Patent Application No. Hei.9-82686 discloses a method of mixing oxygen into the etching gas to form a surface oxide film on poly-Si.

However, if the oxygen density is higher than 50% as described in this bulletin, when etching of the W and $WN_x$ films is completed, a thick oxide film is formed on the underlying poly-Si surface or deposition occurs, whereby etching does not proceed furthermore. In order to remove the thick oxide film or the deposition in the following poly-Si etching, an etching condition having low anti-oxide-film selectivity must be used, and such etching condition leads to penetration through the gate oxide film. Therefore, it is practically difficult to perform, by this method, etching of the poly-metal structure with high controllability.

SUMMARY OF THE INVENTION

The present invention is made to solve the above-described problems and has for its object to provide a dry etching method by which a poly-metal gate structure including tungsten can be fabricated at high mass-productivity while keeping the vertical configuration of the structure with high controllability.

Other objects and advantages of the invention will become apparent from the detailed description that follows. The detailed description and specific embodiments described are provided only for illustration since various additions and modifications within the scope of the invention will he apparent to those of skill in the art from the detailed description.

According to a first aspect of the present invention, there is provided a dry etching method for etching a structure obtained by successively depositing, on a substrate, a gate insulating film, a silicon base film, a tungsten film or an alloy film containing tungsten, wherein the dry etching includes a first process of dry-etching the tungsten film or the alloy film including tungsten, and a second process of dry-etching the silicon base film, and the first process employs, as an etching gas, a gas mixture obtained by mixing $O_2$ gas into a gas including at least C and F, with the flow ratio of the $O_2$ gas being 10~50% by volume percentages. According to the dry etching method of this first aspect, highly precise dry etching is achieved. That is, since the CF base gas is used as a main gas, a vertical configuration of W is easily obtained when the temperature of a susceptor is within a range from 0° C. to 70° C. This is caused by the effect of side-wall protection by C component. That is, since isotropic etching of W by F is suppressed by C component, vertical etching is achieved in the above-mentioned temperature range. Further, addition of $O_2$ increases the selectivity of the W film with respect to the underlying poly-Si film, that is, the poly-Si film becomes resistant to etching, whereby the possibility of penetration through the gate oxide film when etching the W film is prevented. Accordingly, this dry etching method realizes highly-precise dry etching by which a vertical configuration is obtained in a poly-metal electrode structure, and the selection ratio of W to poly-Si can be controlled and, moreover, penetration through the underlying gate oxide film is prevented.

According to a second aspect of the present invention, in the dry etching method of the first aspect, the first process and the second process are carried out in the same chamber. Also this dry etching method realizes highly-precise dry etching by which a vertical configuration is obtained in a poly-metal electrode structure, and the selection ratio of W to poly-Si can be controlled and, moreover, penetration through the underlying gate oxide film is prevented. In addition, etching of the poly-metal structure can be carried out in one chamber, resulting in dry etching that is superior in mass-productivity to the conventional methods.

According to a third aspect of the present invention, in the dry etching method of the first aspect, the first process and the second process are carried out at the same susceptor temperature. Also this dry etching method realizes highly-precise dry etching by which a vertical configuration is obtained in a poly-metal electrode structure, and the selection ratio of W to poly-Si can be controlled and, moreover, penetration through the underlying gate oxide film is prevented In addition, since etching of W or W alloy and etching of poly-Si can be carried out at the same temperature, etching of the poly-metal structure can be carried out in one chamber, resulting in dry etching that is superior in mass-productivity to the conventional methods.

According to a fourth aspect of the present invention, in the dry etching method of the first aspect, $N_2$ gas is further added to the etching gas used in the first process. Addition of the $N_2$ gas has the effect of smoothing the surface of the poly-Si film when etching the W film. This is caused by that $N_2$ or a reaction product including N, which has deposition property, is deposited on concave portions at the poly-Si surface. Accordingly, this dry etching method realizes highly-precise dry etching by which a vertical configuration is obtained in a poly-metal electrode structure having a very thin gate insulating film as a base, and the selection ratio of W to poly-Si can be controlled and, moreover, penetration through the gate insulating film is prevented.

According to a fifth aspect of the present invention, in the dry etching method of the fourth aspect, the mixing ratio of the $N_2$ gas in the etching gas used in the first process is determined such that the flow ratio of the $N_2$ gas to the gas including at least C and F is 2~20% by volume percentages. This dry etching method realizes highly-precise dry etching by which a vertical configuration is obtained in a poly-metal electrode structure having a very thin gate insulating film as a base, and the selection ratio of W to poly-Si can be controlled and, moreover, penetration through the gate insulating film is prevented.

According to a sixth aspect of the present invention, in the dry etching method of the first aspect, one of $Cl_2$, HCl and HBr gases is further added to the etching gas used in the first process. Addition of the $Cl_2$, HCl, or HBr gas has the effect of increasing the etching rate while maintaining anisotropy in etching of the W film. Accordingly, this dry etching method realizes highly-precise dry etching by which a vertical configuration is obtained in a poly-metal electrode structure having a thick metal film, and the selection ratio of W to poly-Si can be controlled and, moreover, penetration through the underlying gate oxide film is prevented.

According to a seventh aspect of the present invention, in the dry etching method of the sixth aspect, the mixing ratio of the $Cl_2$, HCl or HBr gas in the etching gas used in the first process is determined such that the flow ratio of this gas to the gas including at least C and F is 2~20% by volume percentages. This dry etching method realizes highly-precise dry etching by which a vertical configuration is obtained in a poly-metal electrode structure having a thick metal film, and the selection ratio of W to poly-Si can be controlled and, moreover, penetration through the underlying gate oxide film is prevented.

DETAILED DESCRIPTION OF THE PREFERRED EMBODIMENTS

[Embodiment 1]

A first embodiment of the present invention is based on findings relating to the dependence on the flow ratio of $O_2$ gas added to $CF_4$ gas, and provides a dry etching method by which a poly-metal gate structure including a gate insulating film of a normal thickness (about 5 nm) can be fabricated with high controllability and high throughput.

Hereinafter, a description will be given of a dry etching method for fabricating a poly-metal electrode, according to the first embodiment of the present invention. Initially, a dry etching apparatus used for the dry etching method will be described with reference to the drawings.

Figure 2:
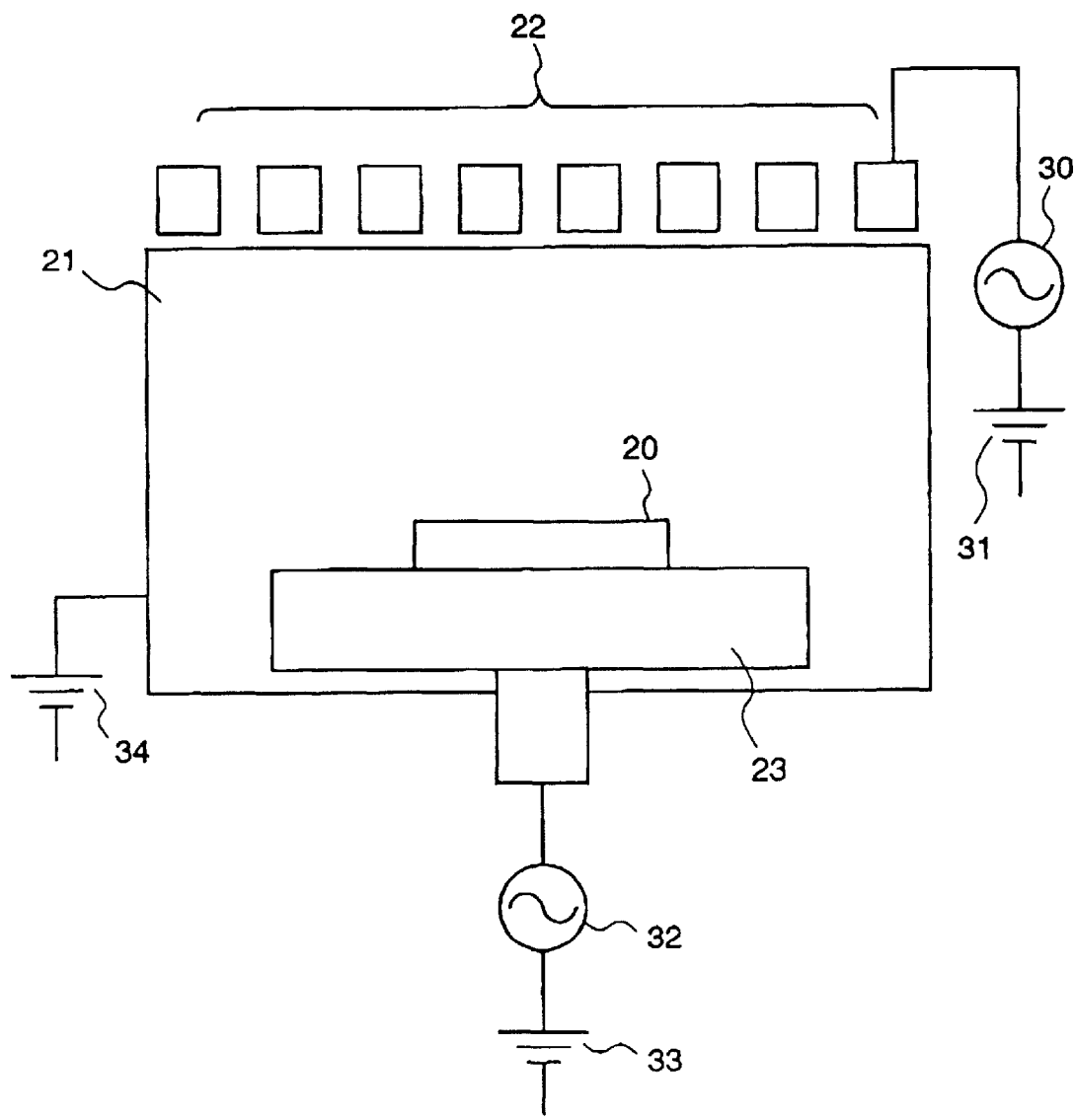
FIG. 2 is a schematic diagram illustrating an etching system used for a dry etching method according to the present invention.

FIG. 2 is a schematic diagram illustrating the structure of a plasma generation apparatus for dry etching. This apparatus is identical to a well-known plasma generation apparatus that is used for an ordinary dry etching process. With reference to FIG. 2, reference numeral 21 denotes a chamber, inner walls of which are covered with an insulating material such as ceramic, alumina, quartz, or the like, and this chamber 21 is grounded. Reference numeral 22 denotes an upper electrode to which a high-frequency power is applied. Further, reference numeral 30 denotes a high-frequency power supply for generating plasma, 31 denotes a ground, 32 denotes a high-frequency power supply for drawing ion, 33 denotes a ground, and 34 denotes a ground for the chamber 21.

The upper electrode 22 is shaped like a coil, and a high-frequency power from the high-frequency power supply 30 is applied to the upper electrode 22, whereby inductive coupling plasma is generated in the chamber. A lower electrode (susceptor) 23 is a sample holder to which a high-frequency power is applied. A wafer 20, from which a desired poly-metal electrode will be formed, is disposed on the surface of the lower electrode 23, and ion energy is controlled by the high-frequency power applied to the lower electrode 23 from the high-frequency power supply 32. The lower electrode 23 contains a system for controlling the electrode temperature by a refrigerant (not shown), whereby the electrode temperature is controlled in a range from about −30° C. to 100° C. An etching gas is introduced into the chamber 21 through a mass flow controller (not shown) and a gas inlet (not shown), and the pressure in the chamber 21 is maintained at about 0.1 Pa~10 Pa by a turbo pump (not shown).

Figure 1A:
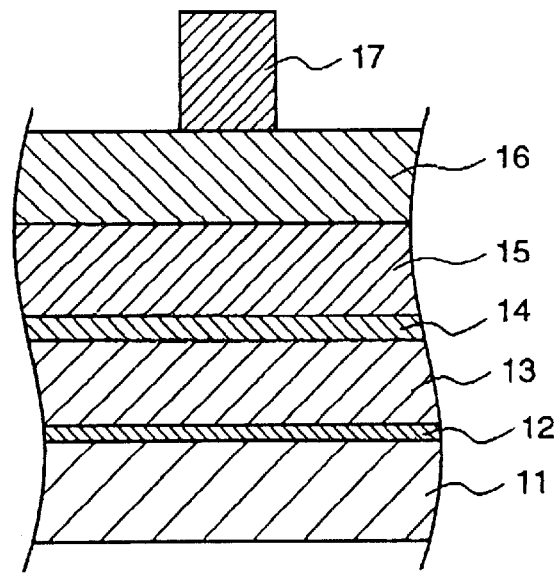
FIGS. 1(a)–1(c) are cross-sectional views for explaining a poly-metal gate etching process.
Figure 1B:
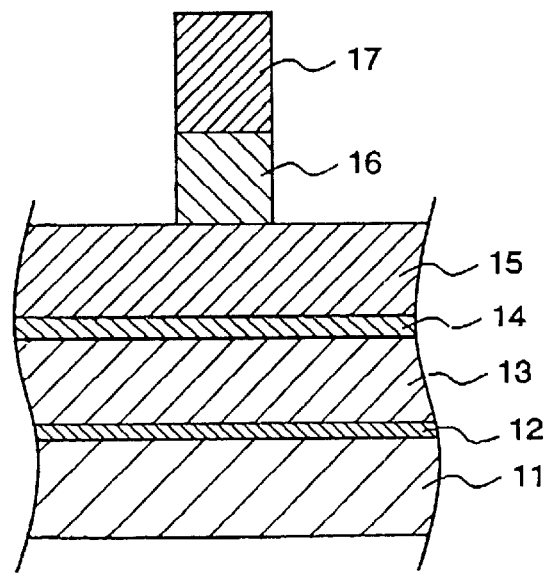
Figure 1C:
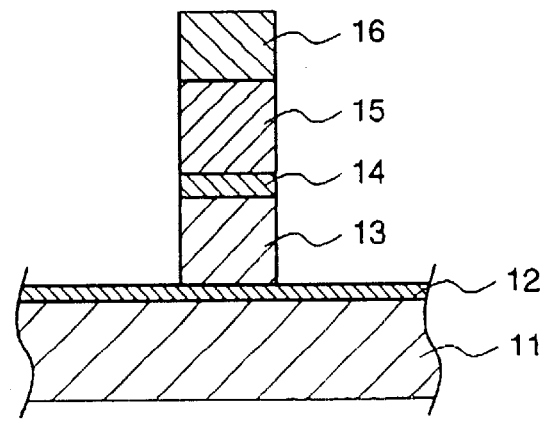

The structure of films to be etched is identical to that shown in FIG. 1.

The dry etching method according to the first embodiment employs the dry etching plasma generation apparatus shown in FIG. 2 for etching of the W film 15 and the $WN_x$ film 14, and for etching of the underlying poly-Si film 13.

Figure 6:
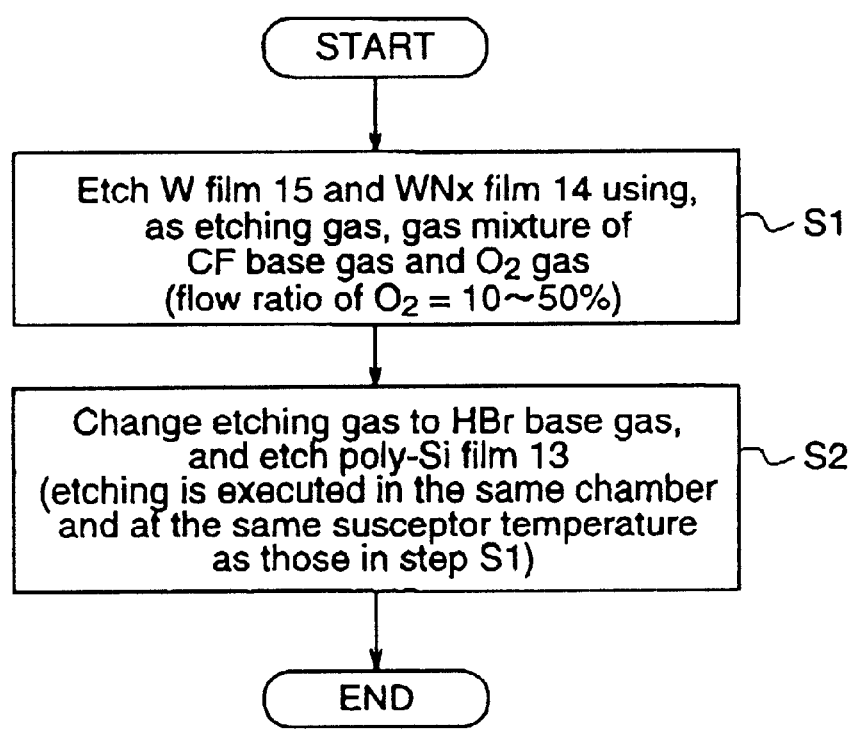
FIG. 6 is a flow chart for explaining the process flow of the dry etching method according to the first embodiment.

To be specific, as shown in step S1 of FIG. 6 (first process), plasma is generated by the dry etching plasma generation apparatus shown in FIG. 2 using, as an etching gas, a mixture of CF base gas and $O_2$ gas (the flow ratio of $O_2$ is 10~50%), thereby etching the W film 15 and the $WN_x$ film 14 shown in FIG. 1.

Next, as shown in step S2 (second process), the etching gas is switched to HBr base gas to etch the poly-Si film 13. In step S2, the same chamber as that used in step S1 is used because the susceptor temperature may be equal to that in step S1.

Switching from step S1 to step S2 will be described in more detail. Initially, plasma generation in step S1 is stopped. Then, supply of the etching gas is stopped, and the chamber is evacuated. This process requires 5~10 seconds. Next, the etching gas for step S2 is introduced into the chamber, and the pressure and the flow quantity are stabilized. This process requires 5~10 seconds and, thereafter, plasma is generated. It takes about 20 seconds from step S1 to start step S2, and the wafer remains in the same chamber. However, since plasma generation is stopped during this period of time, no problem occurs due to switching of the etching conditions from step S1 to step S2.

Thereby, vertical etching configuration is achieved in both of the W ($WN_x$) film and the poly-Si film, and etching can be reliably stopped on the gate oxide film.

The etching gas used in step S1 is selected based on the following viewpoints and findings.

① First of all, controllability must be secured in the poly-metal structure where the W film is thin, and a high etching rate, like that required in formation of a bit line, is not required. Therefore, CF base etching gas that generates less F radicals is employed.

② Since F is small in atomic number, it is easy to invade into between W atoms, whereby etching is apt to be isotropic. However, when using the CF base etching gas, isotropic etching is suppressed by the effect of side-wall protection that is possessed by the C component.

③ The temperature of the susceptor that permits vertical etching of the W film by the CF base etching gas is 0° C.~70° C., and this agrees with the temperature range of the susceptor that permits vertical etching when the poly-Si film is etched by HBr base gas.

④ The etching gas employs not only the CF base gas, but $O_2$ gas is added to the CF base gas to increase the selectivity of the W film with respect to the underlying poly-Si film.

⑤ The quantity of the $O_2$ gas to be added is 10~50% in flow ratio. This quantity is found to be necessary for practically proceeding etching of the target W film without etching the gate oxide film.

Hereinafter, these findings and actual etching conditions will be described in more detail.

Figure 3:
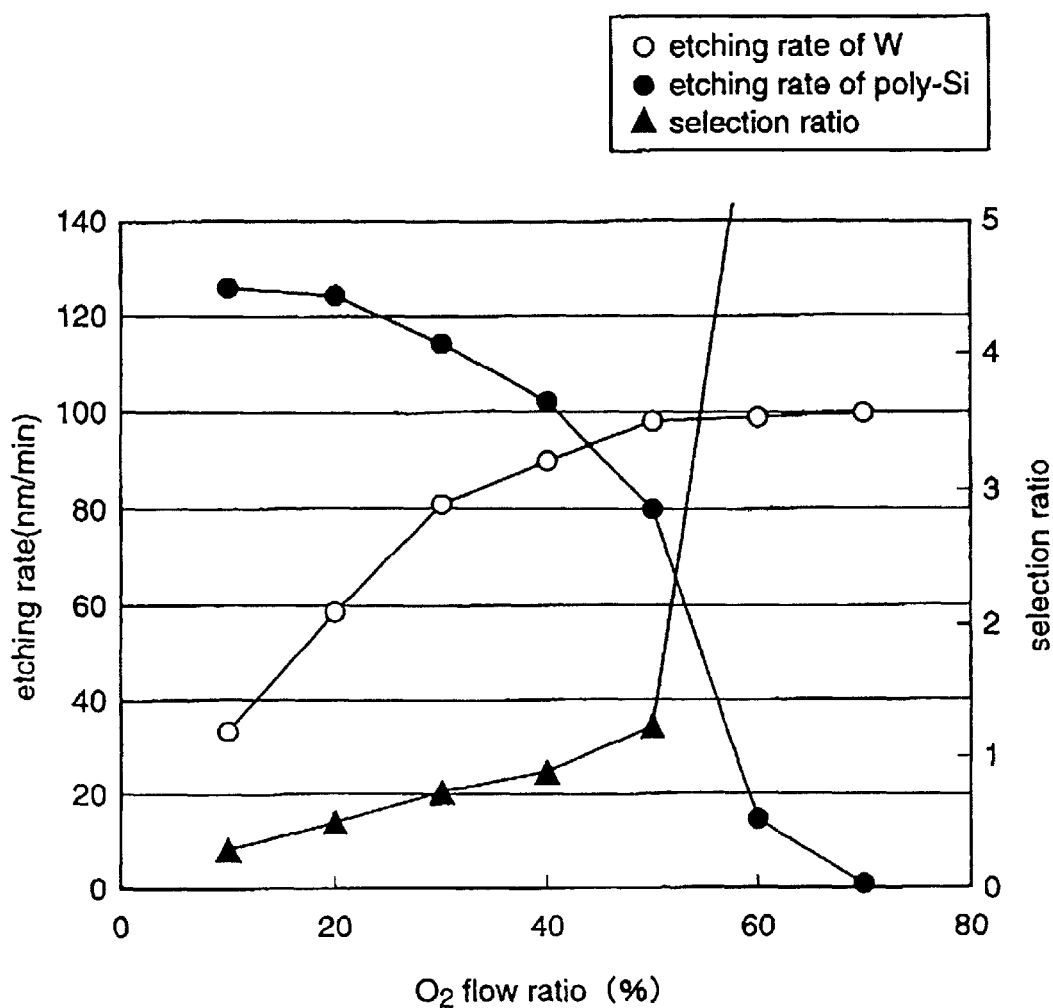
FIG. 3 is a diagram illustrating the dependence of the etching rates of a W film and a poly-Si film on the $O_2$ flow ratio, and the dependence of the selection ratio on the $O_2$ flow ratio, according to a first embodiment of the present invention.

FIG. 3 is a graph showing the dependence of the etching rates of the W film and the poly-Si film on the $O_2$ flow ratio, and the dependence of the selection ratio (etching rate of W/etching rate of poly-Si) on the $O_2$ flow ratio.

The etching conditions are as follows: the voltage applied to the upper electrode is 300W, the voltage applied to the lower electrode (susceptor) is 150W, the chamber pressure is 0.3 Pa, and the temperature of the lower electrode is 50° C. As shown in FIG. 3, as the $O_2$ flow ratio increases, the etching rate of the W film increases, and it tends to be saturated when the $O_2$ flow ratio (volume percentages) exceeds 60%. Conversely, as the $O_2$ flow ratio increases, the etching rate of the poly-Si film decreases, and it decreases abruptly from about where the $O_2$ flow ratio exceeds 50%.

Therefore, the selection ratio increases with increase in the $O_2$ flow ratio. This increase in the selection ratio with increasing $O_2$ flow ratio is caused by that etching of the poly-Si film is prevented by oxidation of the surface of the poly-Si film or deposition of an oxide base reaction product on the surface of the poly-Si film, while the vapor pressure of $WF_xO_y$ generated by etching of the W film is high. With reference to FIG. 3, a very high selection ratio exceeding "5" is obtained when the $O_2$ flow ratio is higher than 50%.

However, as already described above, in the region where the $O_2$ flow ratio is higher than 50%, the oxide film on the surface of the poly-Si film cannot be removed unless etching of the poly-Si film is carried out under the condition that provides a low selectivity of poly-Si with respect to the oxide film.

Therefore, in etching of the poly-metal structure shown in FIG. 1, etching cannot be stopped at the gate oxide film 12 beneath the poly-Si film 13, and the Si substrate 11 might be etched.

On the other hand, when the $O_2$ flow ratio is low, since the selection ratio is low, the poly-Si film 13 and the gate oxide film 12 might be etched when over-etching occurs in etching of the W film 15.

As described above, in etching of the poly-metal gate structure, the range of effective $O_2$ flow ratio is 10~50 volume %.

Figure 4:
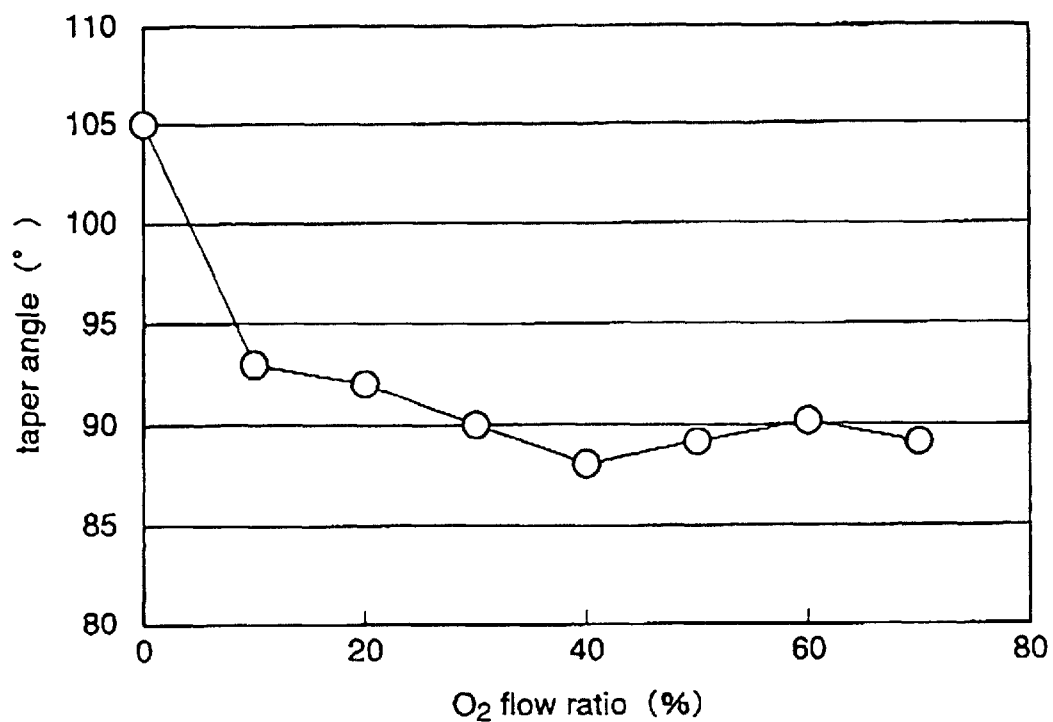
FIG. 4 is a diagram illustrating the dependence of the etching configuration of a W film on the $O_2$ flow ratio, according to the first embodiment of the present invention.

FIG. 4 shows the dependence of the etching configuration on the $O_2$ flow ratio. In FIG. 4, the ordinate indicates the taper angle of the cross-sectional configuration, and the angle under 90° indicates a taper configuration, 90° indicates a vertical configuration, and the angle over 90° indicates an inverted-taper configuration. The vertical configuration is obtained when the $O_2$ flow ratio is within the range of 10~50 volume %.

Based on the above-described findings, etching of the poly-metal gate structure is carried out.

The etching conditions for the W and $WN_x$ films are as follows: $CF_4$=75 ml/min (hereinafter, "ml/min" means the quantity of flow per unit volume under the normal condition), $O_2$=25 ml/min, pressure=0.5 Pa, voltage applied to the upper electrode=600W, voltage applied to the lower electrode=100W, and temperature of the lower electrode= 50° C. The etching conditions for the poly-Si film are as follows: HBr=80 ml/min, $O_2$=3 ml/min, pressure=0.4 Pa, voltage applied to the upper electrode=300W, voltage applied to the lower electrode=50W, and temperature of the lower electrode=50° C. As the result, a nearly vertical configuration is obtained as an etching configuration, and there occurs no penetration through the gate oxide film and no generation of etching residuals, resulting in favorable etching characteristics.

As described above, according to the dry etching method of the first embodiment, when a poly-metal gate structure is obtained by dry etching, a gas mixture obtained by mixing $CF_4$ and $O_2$ with the flow ratio of $O_2$ being 10~50% is used as an etching gas for a W film and a $WN_x$ film, and HBr base gas is used as an etching gas for a poly-Si film. Thereby, etching of the W and $WN_x$ films and etching of the poly-Si film can be carried out at the same susceptor temperature and, therefore, etching of the poly-metal structure can be carried out in the same etching chamber. As the result, a complicated method in which etching is carried out using two etching chambers, like the conventional method, is not necessary, and a gate electrode can be fabricated at a high throughput.

Further, since the gas including $CF_4$ is used as an etching gas for the W and $WN_x$ films, the etching rate of the W and $WN_x$ films in the poly-metal structure can be suppressed, whereby controllability is increased to prevent penetration of the gate oxide film and, moreover, the side walls of the W and $WN_x$ films are protected to obtain a vertical etching pattern.

Furthermore, since the temperature range of the susceptor when performing etching on the W film and the $WN_x$ film agrees with the temperature range in which a vertical etching pattern is obtained when the poly-Si film is etched using the HBr base, a vertical etching pattern of the poly-Si film is easily obtained.

In this way, the first embodiment of the present invention provides a very important process technique in a semiconductor manufacturing process for a high-performance device.

In the first embodiment, the same results as described above are achieved even when a gas mixture of $C_2F_6$ and $O_2$ is used as an etching gas for the W and $WN_x$ films. Also in this case, it is possible to perform vertical etching of W while maintaining the selectivity of W with respect to the underlying poly-Si by the CF base gas and $O_2$ gas.

While in this first embodiment the temperature of the susceptor is 50° C., the same results as mentioned above are achieved when the temperature of the susceptor is within the range of 0° C.~70° C., whereby vertical etching of W and poly-Si is achieved.

[Embodiment 2]

A second embodiment of the present invention is based on findings relating to the dependence on the quantity of $N_2$ gas to be added, and provides a dry etching method by which a poly-metal structure can be fabricated with high controllability even when the poly-metal structure includes a very thin gate insulating film (about 3 nm or less).

Although the first embodiment is effective when the gate oxide film is about 5 nm thick, the following drawback will occur when the first embodiment is applied to a device structure having a very thin gate oxide film of 3 nm or less.

When forming the stacked-layer structure shown in FIG. 1(a), unevenness occurs at the surface of the poly-Si film, and this unevenness of the underlying poly-Si film reflects on the shape of the W film. Therefore, even when anisotropic etching is performed on the W film and tho poly-Si film, there will occur portions where the poly-Si film remains and portions where the gate oxide film is locally exposed in the vicinity of the end point of etching on the poly-Si film, and the exposed gate oxide film might be penetrated.

Therefore, in the poly-metal structure having the very thin gate oxide film of 3 nm or less, it is necessary to reduce the unevenness of the underlying poly-Si film when etching the W film.

In this second embodiment, the above-mentioned problem is solved by performing etching of the W film using $CF_4$, $O_2$, and $N_2$ gases. To be specific, although the second embodiment is identical to the first embodiment in respect of using $CF_4$ and $O_2$ gases, the second embodiment employs, in step S1 of FIG. 6, an etching gas obtained by adding $N_2$ to the $CF_4$ and $O_2$ gases. The added $N_2$ can smooth the surface of the poly-Si film when etching the W film. This is because $N_2$ or a reaction product including N, which has deposition property, is deposited on the concave portions at the surface of the poly-Si film to reduce the unevenness.

Based on the above-mentioned findings, etching of the poly-metal gate structure is carried out. In the experiment, the thickness of the gate oxide film is 2.5 nm.

The etching conditions for the W and $WN_x$ films are as follows: $CF_4$=75 ml/min, $O_2$=25 ml/min, $N_2$=10 ml/min, pressure=0.6 Pa, voltage applied to the upper electrode=650W, voltage applied to the lower electrode=120W, and temperature of the lower electrode=50° C. The etching conditions for the poly-Si film are as follows: HBr=80 ml/min, $O_2$=3 ml/min, pressure=0.4 Pa, voltage applied to the upper electrode=300W, voltage applied to the lower electrode=50W, and temperature of the lower electrode=50° C. As the result, a nearly vertical configuration is obtained as an etching configuration, and there occur no penetration through the gate oxide film and no generation of etching residuals, resulting in favorable etching characteristics.

In this second embodiment, as a result of investigating the range of $N_2$ to be added, it is found that the effective $N_2$ gas ratio is 2~20 volume %. In the region where the $N_2$ gas ratio is less than 2%, the effect of reducing the unevenness of the poly-Si film cannot be obtained. On the other hand, in the region where the $N_2$ gas ratio exceeds 20%, the etching rate decreases considerably, and particles are generated in the chamber.

As described above, according to the dry etching method of the second embodiment, when a poly-metal gate structure is formed by dry etching, etching is carried out using, as an etching gas for a W film and a $WN_x$ film, a gas that is obtained by mixing $N_2$ at a flow ratio of 2~20 volume % to a gas that is obtained by mixing $O_2$ at a flow ratio of 10~50 volume % to $CF_4$. Therefore, even when a gate oxide film is very thin, a vertical poly-metal structure can be produced at high mass-productivity, without penetration through the gate oxide film.

[Embodiment 3]

A third embodiment of the present invention is based on findings relating to the dependence on the quantity of Cl or Br base gas to be added, and provides a dry etching method by which a poly-metal structure can be fabricated with high controllability even when the poly-metal structure includes a thick tungsten (W) film (100 nm or more).

Although the first and second embodiments of the invention are effective when the W film is thinner than 100 nm, the following drawbacks occur when the W film is thicker than 100 nm.

As is evident from FIG. 3, the etching rate to obtain a vertical configuration of W by $CF_4$ and $O_2$ gases is about 100 nm/min. When the thickness of the W film 15 shown in FIG. 1 is increased (e.g., 200 nm) to reduce the resistance of the gate electrode, two minutes or more is required for only etching of the W film and, therefore, this is not practical. Although it may be thought, as a countermeasure against this problem, that the etching rate is increased by increasing the $CF_4$ ratio, if the $CF_4$ ratio is increased, the W film might be side-etched.

Therefore, in the poly-metal structure having the W film thicker than 100 nm, it is necessary to increase the etching rate while maintaining the verticality of the W film.

In this third embodiment, the above-mentioned problem is solved by performing etching of the W film with $CF_4$, $O_2$, and $Cl_2$ gases. To be specific, although this third embodiment is identical to the first embodiment in respect of using $CF_4$ and $O_2$ gases, this third embodiment employs, in step S1 of FIG. 6, an etching gas obtained by adding $Cl_2$ gas to the $CF_4$ and $O_2$ gases. By using such gas mixture of heterohalogen gases, the etching rate is increased without side-etching of the W film. This effect is caused by that a reaction product ($WCl_xO_y$) is generated.

Figure 5:
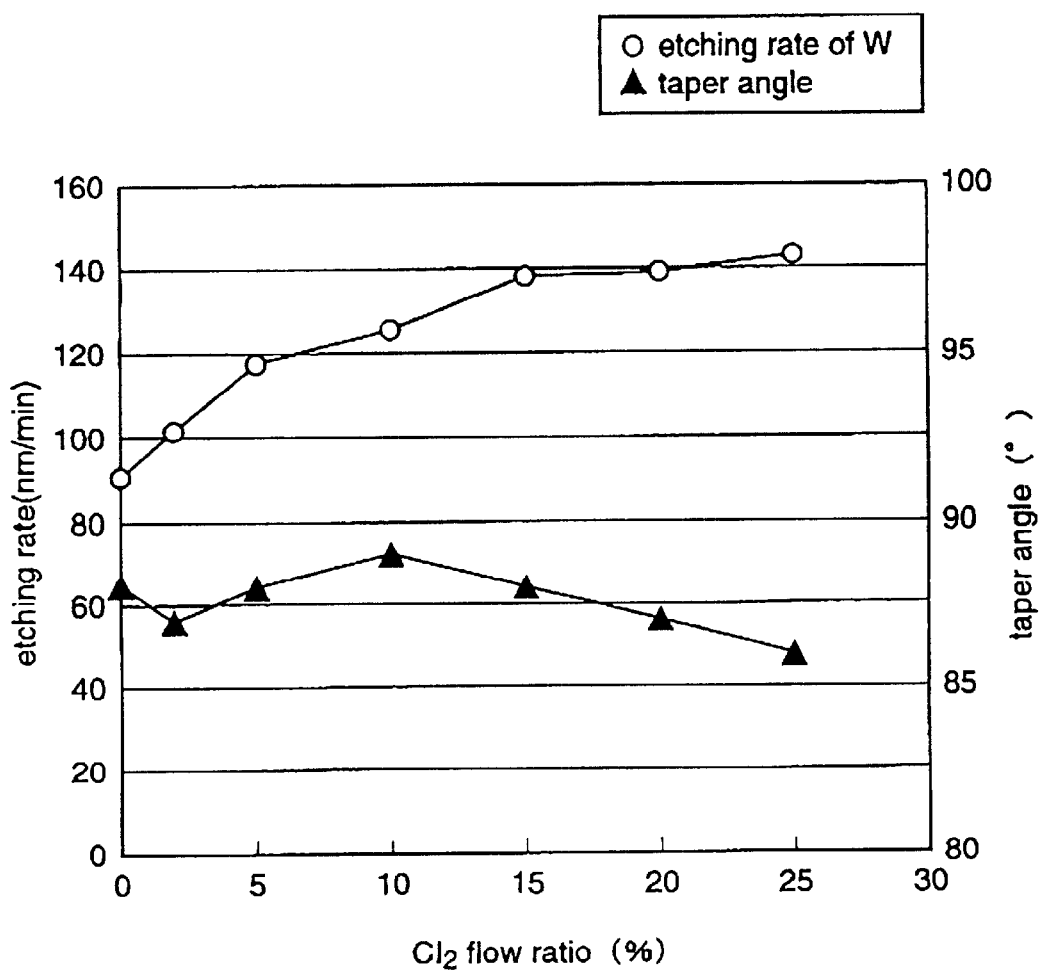
FIG. 5 is a diagram illustrating the dependence of the etching rate and etching configuration of a W film on the $Cl_2$ flow ratio, according to a third embodiment of the present invention.

FIG. 5 shows the dependence of the etching rate of the W film on the $Cl_2$ flow ratio, and the dependence of the cross-sectional configuration on the $Cl_2$ flow ratio. The taper angle of the cross-sectional configuration is as follows: the angle under 90° indicates a taper configuration, 90° indicates a vertical configuration, and the angle over 90° indicates an inverted-taper configuration. The range of effective $Cl_2$ flow ratio is 2~20%.

Based on the above-mentioned findings, etching is carried out on the poly-metal gate structure.

The etching conditions for the W and $WN_x$ films are as follows: $CF_4$=75 ml/min, $O_2$=25 ml/min, $Cl_2$=20 ml/min, pressure=0.6 Pa, voltage applied to the upper electrode=600W, voltage applied to the lower electrode=120W, and temperature of the lower electrode=50° C. The etching conditions for the poly-Si film are as follows: HBr=80 ml/min, $O_2$=3 ml/min, pressure=0.4 Pa, voltage applied to the upper electrode=300W, voltage applied to the lower electrode=50W, and temperature of the lower electrode=50° C. As the result, a nearly vertical configuration is obtained as an etching configuration, and there occurs no penetration through the gate oxide film and no generation of etching residuals, resulting in favorable etching characteristics.

Further, in this third embodiment, the same effects as mentioned above are achieved even when the gas to be added to $CF_4$ and $O_2$ is HBr or HCl.

As described above, according to the dry etching method of the third embodiment, when a poly-metal gate structure is obtained by dry etching, etching is carried out using, as an etching gas for a W film and a $WN_x$ film, a gas that is obtained by adding $Cl_2$ at a flow ratio of 2~20 volume % to a gas obtained by mixing $O_2$ at a flow ratio of 10~50 volume % to $CF_4$. Therefore, even when the W film is thick, the etching rate can be increased without side-etching of the W film, whereby a vertical poly-metal structure can be produced at high mass-productivity.

While in the first to third embodiments a dry etching apparatus as shown in FIG. 2, a so-called ICP (Inductive Coupled Plasma) apparatus, is employed, other dry etching apparatuses may be employed. For example, dry etching apparatuses having plasma sources, such as RIE (Reactive Ion Etching), ECR (Electron Cyclotron Resonance) and the like, can be employed with the same effects as mentioned above.

Further, while in the first to third embodiments $WN_x$ is used as an example of a W alloy, other W alloys, such as $WSi_x$, $WSi_xN_y$, and the like, may be used with the same effects as mentioned above.

Furthermore, while in the first to third embodiments a silicon substrate is used as an example of a semiconductor substrate, a SOI substrate or the like may be used with the same effects as mentioned above. Further, a compound semiconductor substrate may be used.

What is claimed is:

1. A dry etching method for etching a poly-metal electrode gate structure obtained by successively depositing, on a substrate, a gate insulating film, a film that consists of silicon, and a tungsten film, wherein:

said dry etching includes a first process of dry-etching the tungsten film until the surface of the film that consists of silicon is oxidized, and a second process of dry-etching the silicon base film, wherein said first process employs, as an etching gas, a gas mixture obtained by mixing $O_2$ gas into a gas including at least $CF_4$, with the flow ratio of the $O_2$ gas being 10 to 50% by volume percentages and said second process employs, as an etching gas, a gas mixture in which no fluorinated hydrocarbon is used.

2. The dry etching method of claim 1, wherein the first process and the second process are carried out in the same chamber.

3. The dry etching method of claim 1, wherein the first process and the second process are carried out at the same susceptor temperature.

4. The dry etching method of claim 1, wherein $N_2$ gas is further added to the etching gas used in the first process.

5. The dry etching method of claim 4, wherein the mixing ratio of the $N_2$ gas in the etching gas used in the first process is determined such that the flow ratio of the $N_2$ gas to the gas including at least $CF_4$ is 2 to 20% by volume percentages.

6. The dry etching method of claim 1, wherein one of $Cl_2$, HCl, and HBr gases is further added to the etching gas used in the first process.

7. The dry etching method of claim 6, wherein the mixing ratio of the $Cl_2$, HCl or HBr gas in the etching gas used in the first process is determined such that the flow ratio of this gas to the gas including at least $CF_4$ is 2 to 20% by volume percentages.

8. A dry etching method for etching a poly-metal electrode gate structure obtained by successively depositing, on a substrate, a gate insulating film, a film that consists of silicon, and a tungsten film, wherein:

said dry etching includes a first process of dry-etching the tungsten film until the surface of the film that consists of silicon is oxidized, and a second process of dry-etching the film that consists of silicon;

said first process employs, as an etching gas, a gas mixture obtained by mixing $O_2$ gas into a gas including at least $CF_4$, with the flow ratio of the $O_2$ gas being 10 to 50% by volume percentages; and said second process employs, as an etching gas, a gas mixture consisting essentially of HBr.

* * * * *